US008324006B1

(12) United States Patent
Adler et al.

(10) Patent No.: US 8,324,006 B1
(45) Date of Patent: Dec. 4, 2012

(54) METHOD OF FORMING A CAPACITIVE MICROMACHINED ULTRASONIC TRANSDUCER (CMUT)

(75) Inventors: Steven J. Adler, Saratoga, CA (US); Peter Johnson, Sunnyvale, CA (US); Ira Wygant, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 322 days.

(21) Appl. No.: 12/589,754

(22) Filed: Oct. 28, 2009

(51) Int. Cl.
*H01H 9/00* (2006.01)
*H01L 21/449* (2006.01)

(52) U.S. Cl. ..... 438/50; 438/48; 257/416; 257/E21.597; 310/322; 600/437

(58) Field of Classification Search .................. 310/307, 310/309, 317, 322, 323.19, 334–335, 364–366; 438/48, 50, 53, 412, 479; 257/204, 252, 257/347, 414, 416, 698, E21.597
See application file for complete search history.

(56) References Cited

U.S. PATENT DOCUMENTS

| | | | | |
|---|---|---|---|---|
| 7,564,172 | B1 * | 7/2009 | Huang | 310/328 |
| 7,612,635 | B2 * | 11/2009 | Huang | 333/186 |
| 7,736,931 | B1 * | 6/2010 | Guo | 438/52 |
| 7,741,686 | B2 * | 6/2010 | Khuri-Yakub et al. | 257/416 |
| 7,759,839 | B2 * | 7/2010 | Huang | 310/309 |
| 7,843,022 | B2 * | 11/2010 | Kupnik et al. | 257/416 |
| 7,846,102 | B2 * | 12/2010 | Kupnik et al. | 600/459 |
| 7,880,565 | B2 * | 2/2011 | Huang | 333/186 |
| 8,008,105 | B2 * | 8/2011 | Huang | 438/52 |
| 8,018,301 | B2 * | 9/2011 | Huang | 333/186 |
| 8,222,065 | B1 * | 7/2012 | Smeys et al. | 438/51 |
| 2006/0238067 | A1 * | 10/2006 | Dausch | 310/311 |
| 2007/0122074 | A1 * | 5/2007 | Kim et al. | 385/16 |
| 2007/0228878 | A1 * | 10/2007 | Huang | 310/322 |
| 2007/0264732 | A1 * | 11/2007 | Chen | 438/22 |
| 2008/0048211 | A1 * | 2/2008 | Khuri-Yakub et al. | 257/204 |
| 2008/0194053 | A1 * | 8/2008 | Huang | 438/53 |

(Continued)

OTHER PUBLICATIONS

Xuefeng Zhuang, et al., "Wafer-Bonded 2-D CMUT Arrays Incorporating Through-Wafer Trench-Isolated Interconnects with a Supporting Frame", IEEE Transactions on Ultrasonics, Ferroelectrics and Frequency Control, vol. 56, No. 1, Jan. 2009, p. 182-192.

(Continued)

*Primary Examiner* — Matthew Landau
*Assistant Examiner* — Maliheh Malek
(74) *Attorney, Agent, or Firm* — Eugene C. Conser; Wade J. Brady, III; Frederick J. Telecky, Jr.

(57) ABSTRACT

A method includes forming first isolation trenches in a first side of a first semiconductor-on-insulator (SOI) structure to electrically isolate multiple portions of the first SOI structure from each other. The method also includes bonding a second SOI structure to the first SOI structure to form multiple cavities between the SOI structures. The method further includes forming conductive plugs through a second side of the first SOI structure and forming second isolation trenches in the second side of the first SOI structure around the conductive plugs. In addition, the method includes removing portions of the second SOI structure to leave a membrane bonded to the first SOI structure. The isolated portions of the first SOI structure, the cavities, and the membrane form multiple capacitive micromachined ultrasonic transducer (CMUT) elements. Each CMUT element is formed in one of the isolated portions of the first SOI structure and includes multiple CMUT cells.

16 Claims, 6 Drawing Sheets

U.S. PATENT DOCUMENTS

2008/0197751 A1* 8/2008 Huang .......................... 310/311
2008/0203556 A1* 8/2008 Huang .......................... 257/698
2008/0290756 A1* 11/2008 Huang .......................... 310/300
2009/0122651 A1* 5/2009 Kupnik et al. ................ 367/181
2009/0140606 A1* 6/2009 Huang .......................... 310/322
2009/0148967 A1* 6/2009 Wodnicki et al. ............... 438/17
2009/0152980 A1* 6/2009 Huang .......................... 310/309
2009/0250729 A1* 10/2009 Lemmerhirt et al. ......... 257/254
2010/0013574 A1* 1/2010 Huang .......................... 333/186
2010/0168583 A1* 7/2010 Dausch et al. ................ 600/466
2010/0255623 A1* 10/2010 Huang ............................ 438/51
2010/0280388 A1* 11/2010 Huang .......................... 600/459
2011/0040189 A1* 2/2011 Petruzzello et al. .......... 600/459
2011/0073968 A1* 3/2011 Ezaki et al. ................... 257/416
2011/0136284 A1* 6/2011 Huang ............................ 438/52
2011/0215677 A1* 9/2011 Jiang et al. .................... 310/334
2011/0254109 A1* 10/2011 Ossmann et al. ............. 257/415
2012/0187508 A1* 7/2012 Adler et al. ................... 257/416

OTHER PUBLICATIONS

Y. Huang, et al., "Fabricating Capacitive Micromachined Ultrasonic Transducers with Wafer-Bonding Technology", 5 pages.

K. K. Park, et al., "Fabricating Capacitive Micromachined Ultrasonic Transducers with Direct Wafer-Bonding and Locos Technology", MEMS 2008, Tucson, AZ, USA, Jan. 13-17, 2008, p. 339-342.

Peter Smeys, et al., "Method and System for Forming a Capacitive Micromachined Ultrasonic Transducer", U.S. Appl. No. 12/587,139, filed Oct. 2, 2009.

* cited by examiner

METHOD OF FORMING A CAPACITIVE MICROMACHINED ULTRASONIC TRANSDUCER (CMUT)

TECHNICAL FIELD

This disclosure is generally directed to integrated circuits. More specifically, this disclosure is directed to a method of forming a capacitive micromachined ultrasonic transducer (CMUT) and related apparatus.

BACKGROUND

Capacitive micromachined ultrasonic transducer (CMUT) devices are becoming increasingly popular in medical applications. For example, CMUT devices have been used to improve medical ultrasound imaging probes. CMUT devices have also been used to provide high-intensity focused ultrasound for use in medical therapy. Conventional CMUT devices are typically produced directly on a silicon substrate. For instance, conventional CMUT devices are often fabricated using a micro-electro-mechanical system (MEMS) manufacturing technique in which a release layer is etched out, leaving a free-standing membrane. The membrane is then used to transmit and receive ultrasonic signals.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
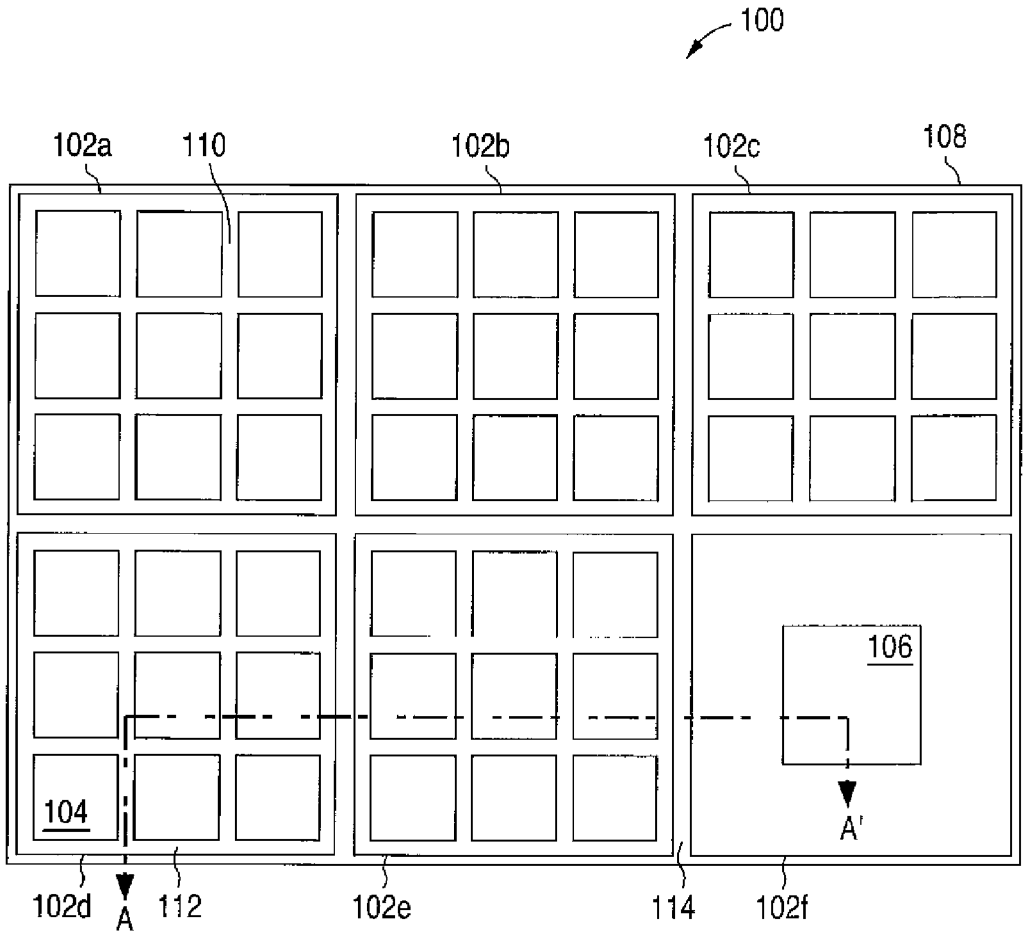
FIGS. 1 and 2 illustrate top and bottom views of an example capacitive micromachined ultrasonic transducer (CMUT) device according to this disclosure.
Figure 2:
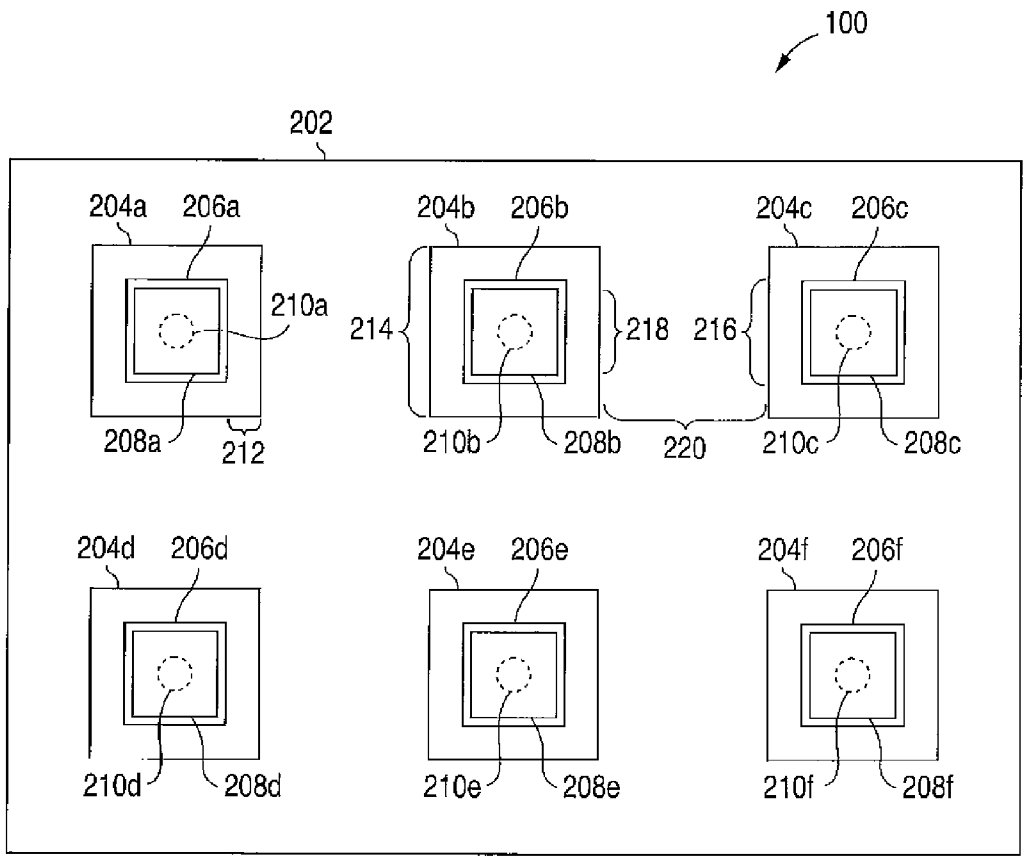

FIGS. 1 and 2 illustrate top and bottom views of an example capacitive micromachined ultrasonic transducer (CMUT) device 100 according to this disclosure. The embodiment of the CMUT device 100 shown in FIGS. 1 and 2 is for illustration only. Other embodiments of the CMUT device 100 could be used without departing from the scope of this disclosure.

In FIG. 1, a top view of the CMUT device 100 is shown. In this example, the CMUT device 100 includes multiple CMUT elements 102*a*-102*e*. An additional CMUT element 102*f* represents an element dedicated to providing an electrical connection to the backside of the CMUT device 100. Here, the CMUT elements 102*a*-102*f* form a two-dimensional array of CMUT elements, namely a 2×3 array of elements. However, the use of a 2×3 array is for illustration only. An array of CMUT elements could include any number of CMUT elements in the "x" and "y" directions, as well as any total number of CMUT elements. Moreover, the CMUT device 100 could include any number of CMUT element arrays, including one array or multiple arrays. Among other things, a two-dimensional array of CMUT elements can be used to obtain improved spatial resolution in applications such as medical imaging or other applications.

As shown in FIG. 1, each of the CMUT elements 102*a*-102*e* includes multiple CMUT cells 104. In this example, each CMUT element 102*a*-102*e* includes nine square CMUT cells 104 arranged in a 3×3 grid. However, each CMUT element 102*a*-102*e* could include any number of CMUT cells 104 in the "x" and "y" directions, as well as any total number of CMUT cells 104. Also, the CMUT cells 104 could have any suitable size and shape, such as round, square, or rectangular shapes. The CMUT cells 104 could have any suitable arrangement within each CMUT element 102*a*-102*e*. As described below, each CMUT cell 104 generally includes a cavity formed between a membrane and an underlying substrate. The membrane can be used to transmit and receive ultrasonic signals. In particular embodiments, the CMUT cells 104 are symmetrically bonded, and each cell in a CMUT element can have its own dedicated cavity. Since the CMUT cells 104 may not share a common vacuum, all cells in a CMUT element 102*a*-102*e* may not fail if a single CMUT cell 104 fails.

In this example, the CMUT element 102*f* includes a contact hole 106, which provides access to an underlying electrical path through the CMUT device 100 to the backside of the CMUT device 100. An electrode 108 formed over the CMUT elements 102*a*-102*f* can contact the underlying electrical path through the contact hole 106. In this way, the electrode 108 may electrically connect to the backside of the CMUT device 100 and then to each CMUT cell 104.

In particular embodiments, the components shown in FIG. 1 could have the following dimensions. Each CMUT cell 104 could have minimum dimensions of approximately 50 μm by 50 μm or 60 μm by 60 μm. A spacing 110 between adjacent CMUT cells 104 in the same CMUT element may be at least 5 μm, and a spacing 112 between a CMUT cell 104 and the edge of its CMUT element may be at least 6 μm. Isolation trenches 114 that separate adjacent CMUT elements 102*a*-102*f* may be at least 4 μm wide. The pitch (defined as the distance between common points in two adjacent CMUT elements) could be 200 μm in both the "x" and "y" directions. The contact hole 106 in the CMUT element 102*f* may be 100 μm by 100 μm. The electrode 108 could extend 1 μm or 2 μm beyond the outermost edges of the CMUT elements 102*a*-102*f*.

In FIG. 2, a bottom view of the CMUT device 100 is shown. In this example, a line 202 denotes the boundary of a substrate (such as a handle wafer) in or on which the CMUT elements 102*a*-102*f* are formed. Here, isolation trenches 204*a*-204*f* are formed in the substrate to help electrically isolate islands 206*a*-206*f* of the substrate from each other.

Each isolated island 206*a*-206*f* has an associated electrical contact 208*a*-208*f* and an associated conductive plug 210*a*-210*f*. The contacts 208*a*-208*f* could represent generally flat metal or other conductive structures, and the conductive plugs 210*a*-210*f* could represent through-silicon vias (TSVs) or other conductive structures. Each of the conductive plugs 210*a*-210*e* electrically connects the CMUT cells 104 in one of the CMUT elements 102*a*-102*e* to its corresponding contact 208*a*-208*e*. The conductive plug 210*f* electrically connects the contact 208*f* with the electrode 108 through the contact hole 106 in the CMUT element 102*f*.

The electrode 108 shown in FIG. 1 can be electrically connected to the conductive plug 210*f* through the contact hole 106. The contact 208*f* is electrically connected to that conductive plug 210*f*, and the contact 208*f* may be electrically connected to the other contacts 208a-208e. Those contacts 208a-208e are in electrical connection with the CMUT cells 104 in the CMUT elements 102a-102e through the conductive plugs 210a-210e. In this way, an electrical connection can be made from the electrode 108 to each CMUT cell 104 in the multiple CMUT elements 102a-102e.

In particular embodiments, the components shown in FIG. 2 could have the following dimensions. Each of the isolation trenches 204a-204f could have a width 212 of 20 μm, and the distance 214 between opposing outer edges of each isolation trench could be 100 μm. Each of the isolated islands 206a-206f could have dimensions (denoted 216) of 60 μm by 60 μm, and each of the contacts 208a-208f could have dimensions (denoted 218) of 50 μm by 50 μm. Each of the conductive plugs 210a-210f could have a diameter of 20 μm, and the pitch between two adjacent conductive vias 208a-208f could be 100 μm. The distance 220 between adjacent isolation trenches in either the "x" or "y" directions may be 100 μm.

In conventional CMUT devices, a two-dimensional CMUT array can be used. However, when conventional CMUT devices form electrical connections to the CMUT array, they typically suffer from excessive parasitic capacitances or require the use of numerous isolation trenches that structurally weaken the CMUT devices.

In the embodiment of the CMUT device 100 shown in FIGS. 1 and 2, the CMUT cells 104 are grouped into CMUT elements 102a-102e. Each CMUT element 102a-102e is associated with a single conductive plug 210a-210e that forms an electrical connection between the multiple CMUT cells 104 in that CMUT element and a corresponding contact 208a-208e. In this way, parasitic capacitance is reduced or minimized. Also, the number of isolation trenches used in the CMUT device 100 is significantly reduced compared to the number of trenches used in conventional CMUT devices. This can help to strength the structure of the CMUT device 100 compared to conventional CMUT devices.

Although FIGS. 1 and 2 illustrate top and bottom views of one example of a CMUT device 100, various changes may be made to FIGS. 1 and 2. For example, the numbers, arrangements, sizes, and shapes of the CMUT cells and CMUT elements are for illustration only. Also, multiple CMUT elements 102f dedicated to providing an electrical connection to the backside of the CMUT device 100 could be used, particularly when a large number of CMUT cells are used in the CMUT device 100.

FIGS. 3A through 3F illustrate an example technique for forming a CMUT device according to this disclosure. In particular, FIGS. 3A through 3F illustrate cross-sections of the CMUT device 100 taken along line A-A' in FIG. 1 during different stages of fabrication. The embodiment of the technique shown in FIGS. 3A through 3F is for illustration only. Other techniques for forming the CMUT device 100 could be used without departing from the scope of this disclosure.

Figure 3A:
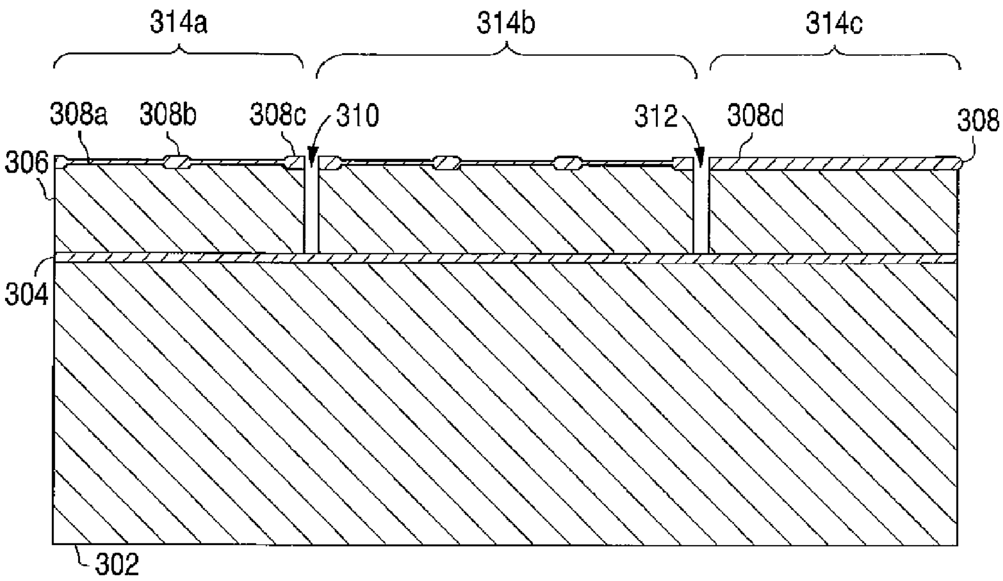
FIGS. 3A through 3F illustrate an example technique for forming a CMUT device according to this disclosure.

As shown in FIG. 3A, fabrication of the CMUT device in this example begins with a first semiconductor-on-insulator (SOI) structure, which includes a handle wafer 302, a buried layer 304, and an active layer 306. The handle wafer 302 represents any suitable semiconductor wafer formed from any suitable material(s), such as undoped or lightly-doped silicon. The buried layer 304 represents any suitable layer(s) of insulative material(s), such as an oxide layer. The active layer 306 represents any suitable layer(s) of material(s) in which integrated circuit devices are formed, such as heavily-doped silicon. In particular embodiments, the handle wafer 302 represents a silicon wafer with a resistance of 10 $\Omega/cm^2$, the buried layer 304 represents an oxide layer that is 2 μm thick, and the active layer 306 represents doped silicon with a resistance of 0.01 $\Omega/cm^2$ and that is 25 μm±0.5 μm thick.

An oxide layer 308 is formed over the first SOI structure. In this example, the oxide layer 308 includes thinner portions 308a and thicker portions 308b-308d, which could be formed using a local oxidation of silicon (LOCOS) process. In particular embodiments, the thinner portions 308a could be 1000 Å or 3000 Å thick, while the thicker portions 308b-308d could be 8500 Å thick (which can help to provide good isolation between CMUT cells 104 being formed). Also, in particular embodiments, the portions 308a could be 30 μm or 60 μm wide, the portions 308b could be 4 μm or 5 μm wide, and the portion 308c could be 12 μm or 16 μm wide.

Isolation trenches 310-312 are formed in the first SOI structure. Each of the trenches 310-312 could be 4 μm wide, and the trenches 310-312 could be formed by masking the first SOI structure and performing a Bosch etch. The trenches 310-312 divide the active area 306 of the first SOI structure into multiple sections 314a-314c. In this example, the sections 314a-314c are associated with different CMUT elements 102d-102f from FIG. 1.

In particular embodiments, the oxide layer 308 could be formed as follows. A mask and etch procedure is used to form frontside alignment marks on the first SOI structure, and a 250 Å pad oxide layer is grown over the first SOI structure. An 1850 Å nitride layer is deposited over the pad oxide layer, such as by using low-pressure chemical vapor deposition (LPCVD). The nitride layer is masked and etched to define the locations of CMUT cells 104 that are approximately 60 μm by approximately 60 μm. In other words, the nitride layer is masked and etched so that it covers the areas where the thinner portions 308a of the oxide layer 308 are to be formed, while exposing the areas where the thicker portions 308b-308d of the oxide layer 308 are to be formed. An approximately 8300 Å oxide layer is grown over the exposed portions of the pad oxide (such as by growing the 8300 Å oxide layer using 1050° C. steam for approximately 140 minutes). The nitride mask is removed such as by stripping, and a 1000 Å cell oxide layer is grown over the first SOI structure (such as by growing the cell oxide layer using 1050° C. steam for approximately 4 minutes). The resulting thickness of the portions 308b-308d is approximately 8500 Å.

Figure 3B:
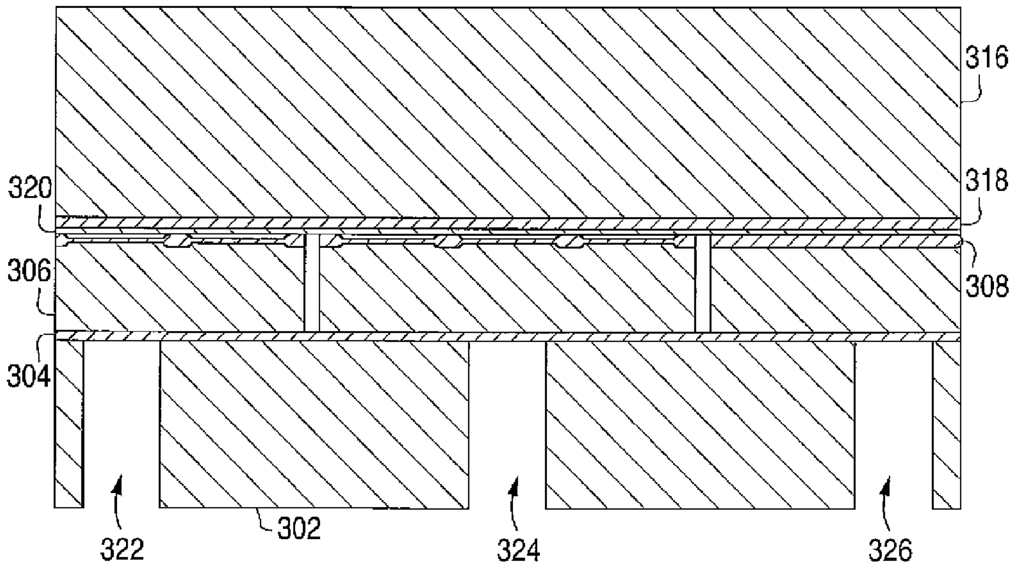

As shown in FIG. 3B, a second SOI structure is bonded to the first SOI structure. In this example, the second SOI structure includes a handle wafer 316, a buried layer 318, and an active layer 320. The handle wafer 316 could represent lightly-doped silicon with a resistance of 10 $\Omega/cm^2$, the buried layer 318 could represent an oxide layer that is greater than 0.5 μm in thickness (such as 1.09 μm), and the active layer 320 could represent a lightly-doped silicon membrane with a resistance of 0.01 $\Omega/cm^2$ and that is 2.2 μm±0.5 μm thick. The second SOI structure could have an overall thickness of 200 μm. The bonding of the first and second SOI structures forms a cavity between adjacent thicker portions of the oxide layer 308, where the cavities are used in different CMUT cells 104. In particular embodiments, the second SOI structure is a VIP10 silicon-on-insulator wafer from NATIONAL SEMICONDUCTOR CORPORATION. Also, in particular embodiments, the first and second SOI structures are vacuum fusion bonded.

The backside of the first SOI structure can be processed to have a desired thickness. This could include, for example, performing a grind and polish operation so that the handle wafer 302 has a thickness of 400 μm. In addition, vias 322-324 are formed through the handle wafer 302. The vias 322-324 could be formed in any suitable manner. For example, a mask and etch could be performed to form backside alignment marks on the handle wafer 302. After that, a mask could be formed, and a Bosch etch that stops at the buried layer 304 could be performed to form the vias 322-324. The vias 322-324 could be approximately 20 μm in diameter, giving an aspect ratio of 20:1 in a 400 μm-thick handle wafer 302. When the handle wafer 302 represents silicon, the vias 322-324 may represent through-silicon vias.

Figure 3C:
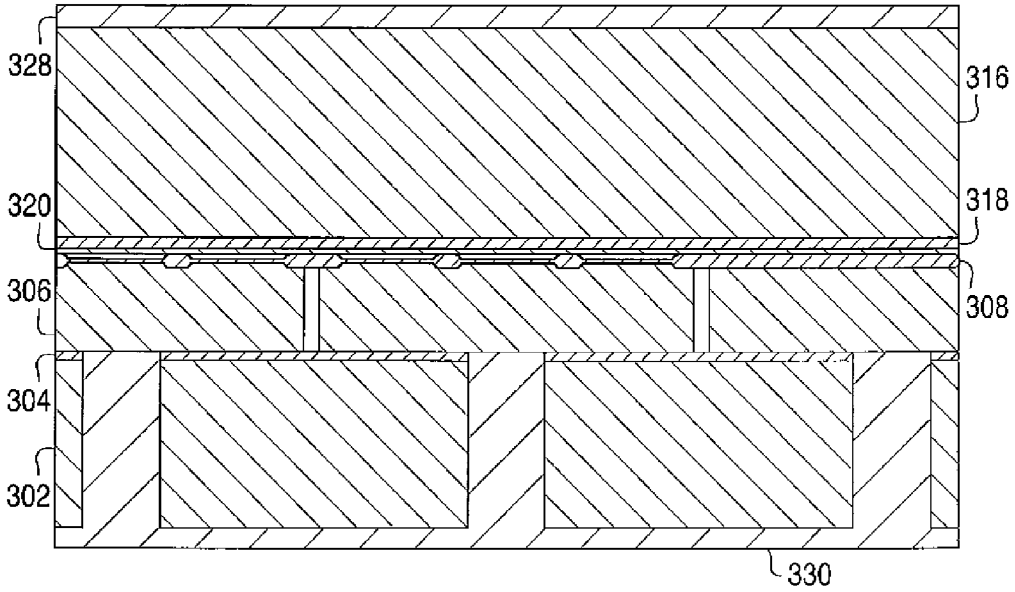

As shown in FIG. 3C, the buried layer 304 within the vias 322-326 is removed, such as by etching. This exposes portions of the active layer 306 within the vias 322-326. Conductive material 328-330 is deposited on the first and second SOI structures (although in other embodiments the conductive material 328 could be omitted). The conductive material 330 is also deposited in the vias 322-326 to form conductive plugs, where one conductive plug is associated with each CMUT element being formed. The conductive material 328-330 could, for example, represent heavily-doped polysilicon with a resistance of 0.01 $\Omega/cm^2$ that fills the vias 322-326 and that is 10 μm thick on the top and bottom surfaces of the structure in FIG. 3C.

Figure 3D:
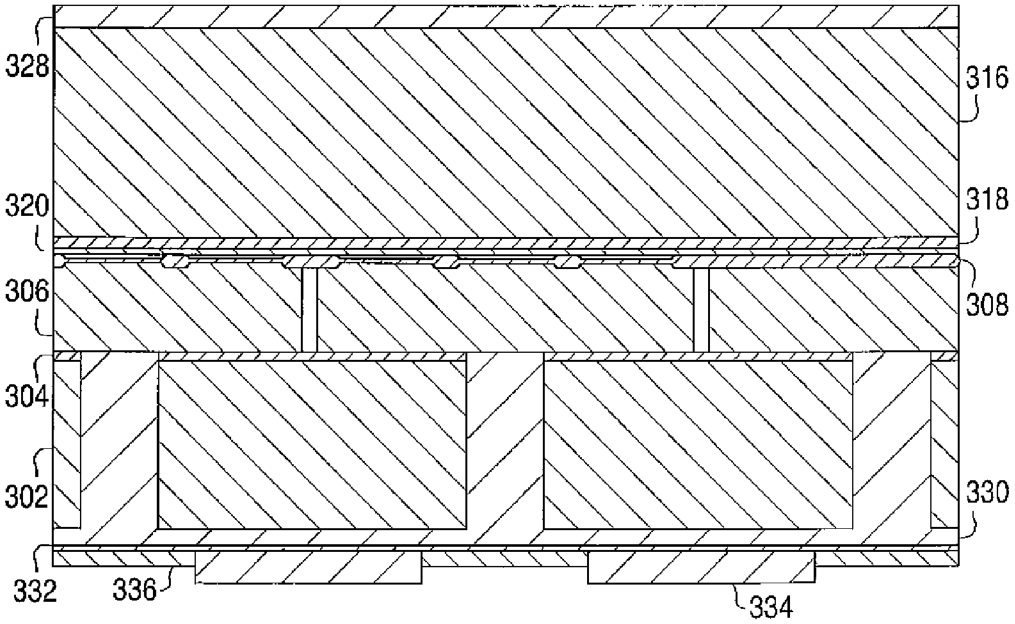

As shown in FIG. 3D, a seed layer 332 is formed over the conductive material 330 on the backside of the structure. The seed layer 332 could, for example, represent a copper and titanium seed layer. A mold mask 334 is formed over the seed layer 332. The mold mask 334 could, for example, represent photoresist material that is patterned to define areas where the electrical contacts 208*a*-208*f* are to be formed. Conductive regions 336 are formed over the seed layer 332 in the areas defined by the mold mask 334. The conductive regions 336 could, for example, represent 15 μm copper formed by deposition using electroplating.

Figure 3E:
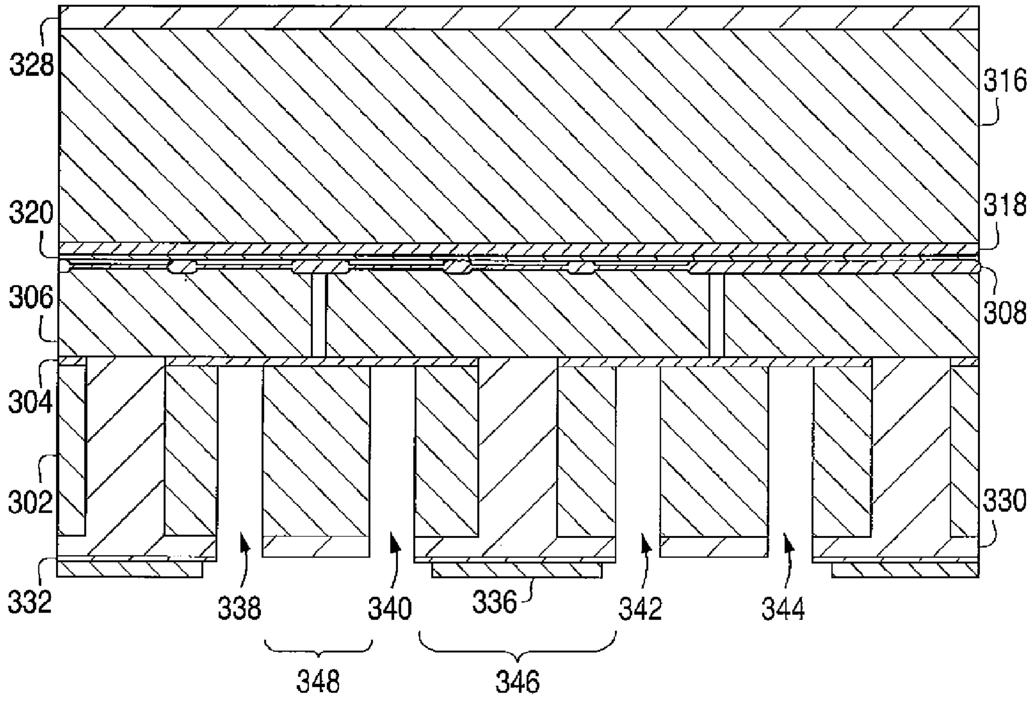

As shown in FIG. 3E, the mold mask 334 is removed, such as by stripping. Also, the seed layer 332 exposed by the now-removed mold mask 334 is also removed, such as by stripping. In addition, isolation trenches 338-344 are formed through the conductive material 330 and the handle wafer 302, such as by using a mask and a Bosch etch. The isolation trenches 338-344 could each be 20 μm wide. Remaining portions of the handle wafer 302 on each side of the vias filled with the conductive material 330 could be 20 μm wide, so a distance 346 in FIG. 3E may be 60 μm. Remaining portions of the handle wafer 302 not containing vias filled with conductive material 330 could be 100 μm thick, so a distance 348 in FIG. 3E may be 100 μm (note that these figures are not drawn to scale). Alternatively, the trenches 338-344 could be formed before plating the copper or otherwise forming the conductive regions 336. In this case, the trenches 338-344 could be filled with one or more materials, such as a dielectric acoustic absorbing material like SU8 or a molding compound.

Figure 3F:
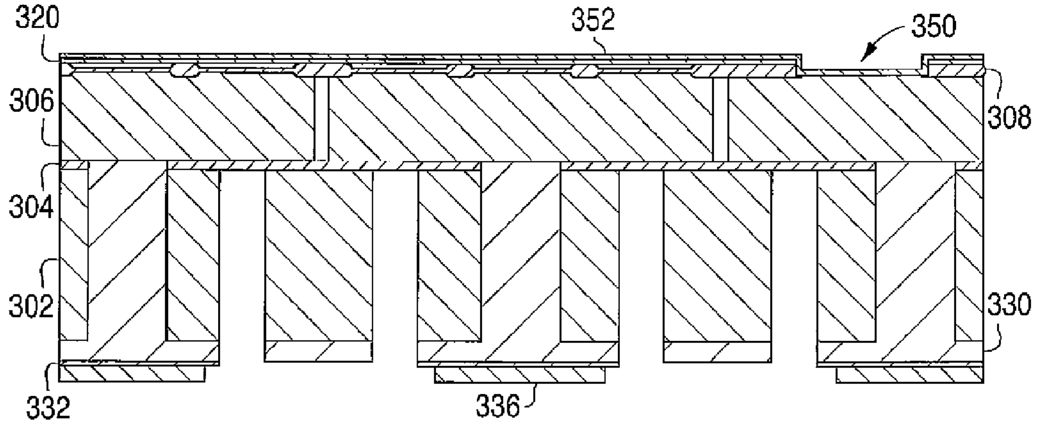

As shown in FIG. 3F, the handle wafer 316 and the buried layer 318 of the second SOI structure are removed, leaving the active layer 320. This could include, for example, etching the handle wafer 316 and stripping the buried layer 318. The active layer 320 forms the membrane over the CMUT cells 104. Also, a contact hole 350 is formed through the active layer 320 and the oxide layer 308, such as by using a mask and etch process. In addition, a conductive stack 352 is formed over the top of the structure shown in FIG. 3F to form a top electrode. The conductive stack 352 could, for example, include a 300 Å layer of titanium and a 2500 Å or 5000 Å layer of aluminum or aluminum-copper that is sputtered onto the structure. Note that any other materials or any number of layers can be used in the conductive stack 352 (including a single layer). As a particular example, titanium tungsten could be used to at least cover sides of the contact hole 350 to ensure an adequate electrical connection. This completes formation of the CMUT device 100.

In this example, the conductive stack 352 forms a common top electrode for all of the CMUT elements 102*a*-102*f* in the CMUT device 100. Also, the conductive stack 352 is electrically connected to one of the conductive regions 336 through a portion of the active layer 306 and the filled via 326. That conductive region 336 could then be electrically connected to the other conductive regions 336, which are electrically connected to various CMUT cells 104 through the other filled vias 322-324 and the other portions of the active layer 306.

Although FIGS. 3A through 3F illustrate one example of a technique for forming a CMUT device 100, various changes may be made to FIGS. 3A through 3F. For example, while these figures illustrate example structures at different manufacturing stages, various techniques can be used to form the each structure. As a result, one or more steps could be omitted, modified, or rearranged and additional steps could be added. As particular examples, with one additional mask step, polysilicon pistons or other pistons can be formed on the membranes of the CMUT cells (on the active layer 320 of the second SOI structure). As another particular example, with one additional mask step, a backside acoustic suppression layer could be patterned. Also, various modifications could be made to the structures shown in FIGS. 3A through 3F. For instance, the relative sizes and shapes of the components are for illustration only.

Figure 4:
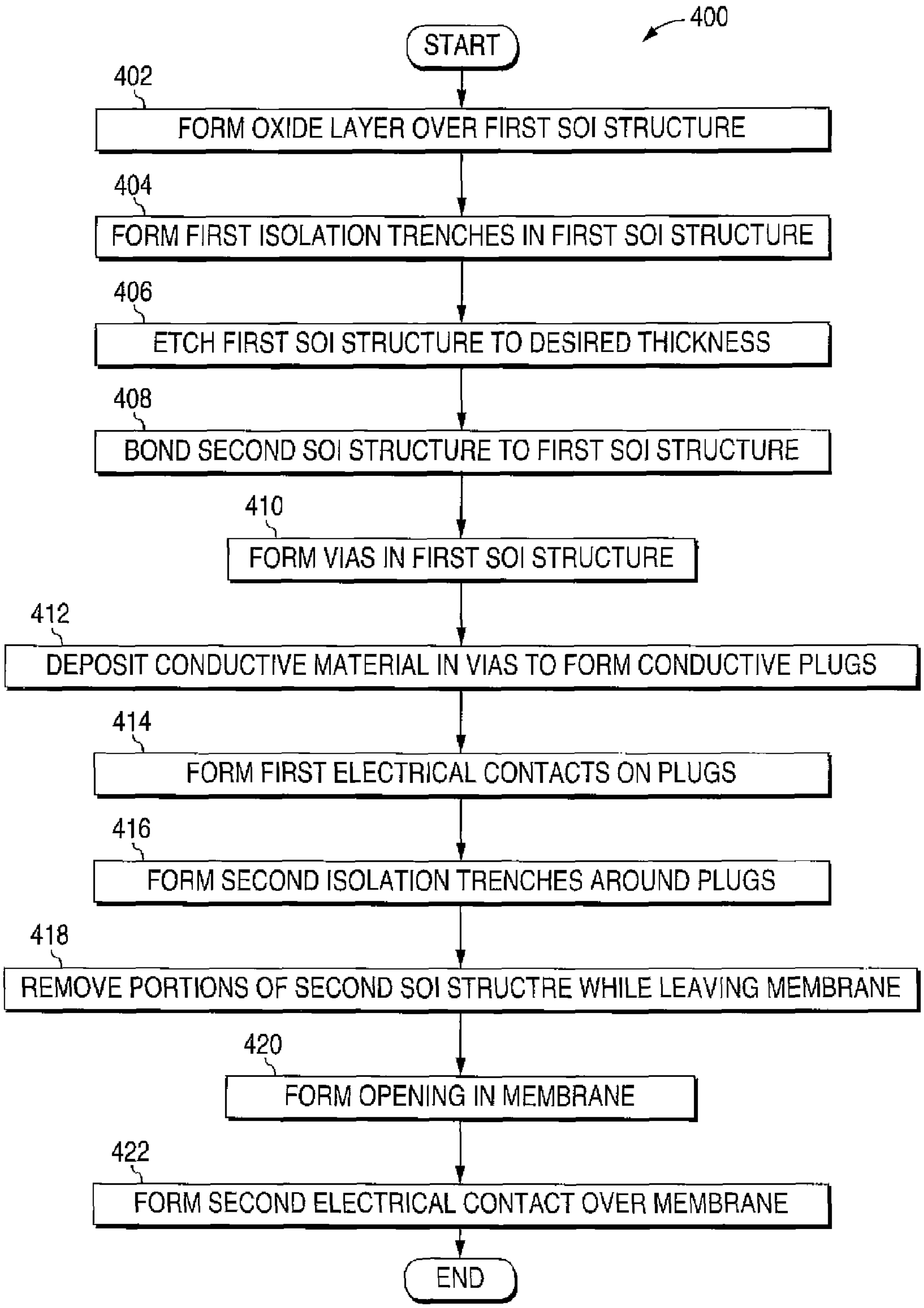
FIG. 4 illustrates an example method for forming a CMUT device according to this disclosure.

FIG. 4 illustrates an example method 400 for forming a CMUT device according to this disclosure. The embodiment of the method 400 shown in FIG. 4 is for illustration only. Other embodiments of the method 400 could be used without departing from the scope of this disclosure.

As shown in FIG. 4, an oxide layer is formed over a first SOI structure at step 402. This could include, for example, forming the oxide layer 308 over the active layer 306 of the first SOI structure using an LOCOS process. First isolation trenches are formed in the first SOI structure at step 404. This could include, for example, forming trenches 310-312 that isolate areas of the active layer 306 in the first SOI structure. The first SOI structure is etched to a desired thickness at step 406. This could include, for example, grinding and polishing the handle wafer 302 of the first SOI structure. The first SOI structure is bonded to a second SOI structure at step 408. This could include, for example, bonding the active layer 320 of the second SOI structure to the oxide layer 308.

Vias are formed in the first SOI structure at step 410. This could include, for example, forming through-silicon vias 322-326 through the handle wafer 302. Conductive material is deposited in the vias to form conductive plugs at step 412. This could include, for example, depositing heavily-doped polysilicon or other conductive material(s) 330 in the vias 322-326. First electrical contacts are formed in electrical connection with the conductive plugs at step 414. This could include, for example, depositing a seed layer 332 over the handle wafer 302, forming the mold mask 334 over the seed layer 332, and forming the conductive regions 336 using electroplating. The mold mask 334 and the remaining seed layer 332 can then be removed, such as by stripping. Second isolation trenches are formed around the conductive plugs at step 416. This could include, for example, forming the trenches 338-344 in the active layer 306 of the first SOI structure.

Portions of the second SOI structure are removed while leaving a membrane at step 418. This could include, for example, removing the handle wafer 316 by etching and removing the buried layer 318 by stripping. The remaining active layer 320 acts as a membrane for the CMUT cells 104. An opening is formed in the membrane at step 420. This could include, for example, etching the contact hole 350 in the active layer 320. A second electrical contact is formed over the membrane at step 422. This could include, for example, depositing one or more conductive layers, such as the conductive stack 352, over the active layer 320 and within the contact hole 350.

Although FIG. 4 illustrates one example of a method 400 for forming a CMUT device, various changes may be made to FIG. 4. For example, while shown as a series of steps, various steps in FIG. 4 could overlap, occur in parallel, or occur in a different order. Also, various steps in FIG. 4 could be omitted, such as when the handle wafer 302 of the first SOI structure already has a desired thickness (and step 406 can be omitted).

It may be advantageous to set forth definitions of certain words and phrases that have been used within this patent document. Terms such as "top," "bottom," "underlying," and "over" refer to relative positions when a structure is viewed from a particular direction and do not limit a device or process to use in that particular direction. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method of forming capacitive micromachined ultrasonic transducer (CMUT) elements comprising:

Providing a first semiconductor-on-insulator (SOI) structure;

wherein the first SOI structure includes a handle wafer, an active layer and a buried layer therebetween; and forming an oxide layer over the active layer of the first SOI structure by means of:

growing a pad oxide layer over the active layer;

depositing a nitride layer over the pad oxide layer;

masking and etching the nitride layer defining the locations of the CMUT elements;

providing a local oxidation of silicon (LOCOS) in the areas of exposed pad oxide, wherein the LOCOS oxide is substantially thicker than the pad oxide and extends above the pad oxide;

removing the nitride layer;

forming isolation trenches in the active layer of the first (SOI) structure to electrically isolate multiple portions of the active layer of the first SOI structure from each other;

bonding a second SOI structure to the LOCOS areas on the active layer side of the first SOI structure;

wherein the bonding of the first and second SOI structures forms multiple cavities between the adjacent thicker LOCOS portions of the oxide layer and the first and second SOI structures;

wherein the second SOI structure includes a second handle wafer, a second buried layer and a second active layer consisting of membrane material;

removing portions of the second SOI structure to leave a membrane bonded to the first SOI structure LOCOS areas, wherein multiple cavities are located between the membrane and the oxide layer of the first SOI structure, forming multiple (CMUT) elements using the isolated portions of the SOI structure, each CMUT element formed in one of the isolated portions of the SOI structure and comprising multiple CMUT cells;

forming electrical connections to the CMUT elements through a second side of the SOI structure; and forming an additional CMUT element that includes a contact hole from the first side of the first SOI structure to the second side of the first SOI structure, the contact hole associated with an electrically conductive path from the first side of the SOI structure to the second side of the SOI structure.

2. The method of claim 1, wherein:

the CMUT elements are formed in a two-dimensional arrangement; and only one electrical connection is formed for each CMUT element.

3. The method of claim 2, wherein the additional CMUT element is disposed in one location of the two-dimensional arrangement.

4. The method of claim 1, further comprising:

forming an electrode over at least some of the CMUT elements, the electrode in electrical connection with the electrically conductive path from the first side of the SOI structure to the second side of the SOI structure through the contact hole of the additional CMUT element.

5. The method of claim 1, wherein forming the electrical connections to the CMUT elements comprises:

forming vias through the second side of the first SOI structure;

depositing conductive material in the vias to form conductive plugs, the conductive plugs in electrical connection with the isolated portions of the first SOI structure; and forming multiple contacts in electrical connection with the plugs.

6. The method of claim 5, further comprising:

forming second isolation trenches in the second side of the first SOI structure around the conductive plugs.

7. A method of forming capacitive micromachined ultrasonic transducer (CMUT) elements comprising:

forming first isolation trenches in a first side of a first semiconductor-on-insulator (SOI) structure to electrically isolate multiple portions of the first SOI structure from each other;

forming an oxide layer over the first side of the first SOI structure by means of:

growing a pad oxide layer over the active layer;

depositing a nitride layer over the pad oxide layer;

masking and etching the nitride layer defining the locations of the CMUT elements;

providing a local oxidation of silicon (LOCOS) in the areas of exposed pad oxide, wherein the LOCOS oxide is substantially thicker than the pad oxide and extends above the pad oxide;

bonding a second SOI structure to the first SOI structure to form multiple cavities between the first and second SOI structures;

wherein the bonding of the first and second SOI structures forms multiple cavities between the adjacent thicker LOCOS portions of the oxide layer and the first and second SOI structures;

forming conductive plugs through a second side of the first SOI structure;

forming second isolation trenches in the second side of the first SOI structure around the conductive plugs;

removing portions of the second SOI structure to leave a membrane bonded to the first SOI structure, wherein the isolated portions of the first SOI structure, the cavities, and the membrane form multiple CMUT elements, each CMUT element formed in one of the isolated portions of the first SOI structure and comprising multiple CMUT cells; and forming an additional CMUT element that includes a contact hole from the first side of the first SOI structure to the second side of the first SOI structure, the contact hole associated with an electrically conductive path from the first side of the first SOI structure to the second side of the first SOI structure.

8. The method of claim 7, wherein:

the CMUT elements are formed in a two-dimensional arrangement; and only one conductive plug is formed for each CMUT element.

9. The method of claim 7, further comprising:

forming multiple contacts in electrical connection with the conductive plugs.

10. The method of claim 7, wherein:

the first SOI structure comprises a first handle wafer, a first buried layer, and a first active area;

the second SOI structure comprises a second handle wafer, a second buried layer, and a second active area;

forming the first isolation trenches comprises forming the first isolation trenches in the first active area;

forming the second isolation trenches comprises forming the second isolation trenches in the first handle wafer; and removing the portions of the second SOI structure comprises removing the second handle wafer and the second buried layer.

11. The method of claim 8 wherein the additional CMUT element that includes the contact hole is disposed in one location of the two-dimensional arrangement.

12. The method of claim 11, further comprising:

forming an electrode over at least some of the CMUT elements, the electrode in electrical connection with the electrically conductive path from the first side of the first SOI structure to the second side of the first SOI structure through the contact hole of the additional CMUT element.

13. The method of claim 7, wherein forming the conductive plugs comprises:

forming vias through the second side of the first SOI structure; and depositing conductive material in the vias to form the conductive plugs in electrical connection with the isolated portions of the first SOI structure.

14. A method of forming capacitive micromachined ultrasonic transducer (CMUT) elements comprising:

forming isolation trenches in a first side of a first semiconductor-on-insulator (SOI) structure to electrically isolate multiple portions of the first SOI structure from each other;

forming multiple capacitive micromachined ultrasonic transducer (CMUT) elements in a two-dimensional arrangement using the isolated portions of the first SOI structure, each CMUT element formed in one of the isolated portions of the first SOI structure and comprising multiple CMUT cells;

wherein the first SOI structure includes a handle wafer, the first side of the SOI structure or an active layer, and a buried layer therebetween; and forming an oxide layer over the first side of the first SOI structure by means of:

growing a pad oxide layer over the active layer;

depositing a nitride layer over the pad oxide layer;

masking and etching the nitride layer defining the locations of the CMUT elements;

providing a local oxidation of silicon (LOCOS) in the areas of exposed pad oxide, wherein the LOCOS oxide is substantially thicker than the pad oxide and extends above the pad oxide;

removing the nitride layer;

bonding a second SOI structure to the LOCOS areas on the first side of the first SOI structure;

wherein the bonding of the first and second SOI structures forms multiple cavities between the adjacent thicker LOCOS portions of the oxide layer and the first and second SOI structures;

wherein the second SOI structure includes a second handle wafer, a second buried layer and a second active layer consisting of membrane material;

removing portions of the second SOI structure to leave a membrane bonded to the first SOI structure LOCOS areas, wherein multiple cavities are located between the membrane and the oxide layer of the first SOI structure thus forming CMUT elements;

forming electrical connections to the CMUT elements through a second side of the SOI structure; and forming an additional CMUT element that includes a contact hole from the first side of the first SOI structure to the second side of the first SOI structure, the contact hole associated with an electrically conductive path from the first side of the first SOI structure to the second side of the first SOI structure.

15. The method of claim 14, wherein the additional CMUT element that includes the contact hole is disposed in one location of the two-dimensional arrangement.

16. The method of claim 15, further comprising:

forming an electrode over at least some of the CMUT elements, the electrode in electrical connection with the electrically conductive path from the first side of the first SOI structure to the second side of the first SOI structure through the contact hole of the additional CMUT element.

* * * * *